United States Patent [19]
Rossi et al.

[11] Patent Number: 5,930,280
[45] Date of Patent: Jul. 27, 1999

[54] LASER SYSTEM WITH REDUCED POWER FLUCTUATIONS FOR EMPLOYMENT IN APPLICATIONS REQUIRING CONTINUOUS STABLE LIGHT INTENSITY DELIVERY

[75] Inventors: David M. Rossi, San Francisco; Harrison L. Ransom, Jr., Foster City, both of Calif.

[73] Assignee: SDL, Inc., San Jose, Calif.

[21] Appl. No.: 09/130,894

[22] Filed: Aug. 7, 1998

Related U.S. Application Data

[62] Division of application No. 08/648,469, May 14, 1996, Pat. No. 5,799,029.

[51] Int. Cl.[6] .................................................. H01S 3/19
[52] U.S. Cl. ............................................. 372/50; 372/103
[58] Field of Search .................................. 372/50, 46, 48, 372/103, 108

[56] References Cited

U.S. PATENT DOCUMENTS

| | | | |
|---|---|---|---|
| 5,070,509 | 12/1991 | Meyers | 372/50 |
| 5,139,609 | 8/1992 | Fields et al. | 372/50 |
| 5,274,657 | 12/1993 | Hori et al. | 372/50 |
| 5,385,092 | 1/1995 | Lewis et al. | 101/467 |
| 5,485,481 | 1/1996 | Ventrudo et al. | 372/6 |

*Primary Examiner*—Rodney Bovernick
*Assistant Examiner*—Robert E. Wise
*Attorney, Agent, or Firm*—W. Douglas Carothers, Jr.

[57] ABSTRACT

A laser system is provided for supplying high power, stable light intensity via an aperture limited delivery system to an application requiring continuous light output intensity in spite of the laser source being subjected optical feedback noise caused by external system and delivery system perturbations that cause fluctuation in laser source power intensity. Non-stable light intensity in the output is due to environmental temperature changes, and phase and amplitude changes caused by system induced perturbations such as by movement of the aperture limited delivery system and optical artifacts of the optical elements, comprising the aperture limited delivery system, introducing noise into the feedback in the laser system changing the output intensity pattern of the delivered power beam. This can be substantially remedied by the employing a monolithic, multiple, independent single mode laser source which is substantially unaffected by this noise.

14 Claims, 2 Drawing Sheets

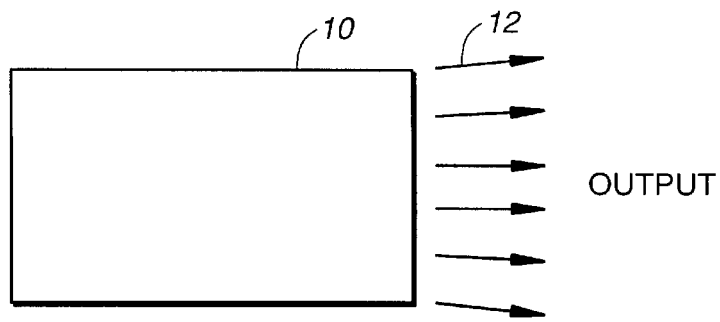
FIG._1
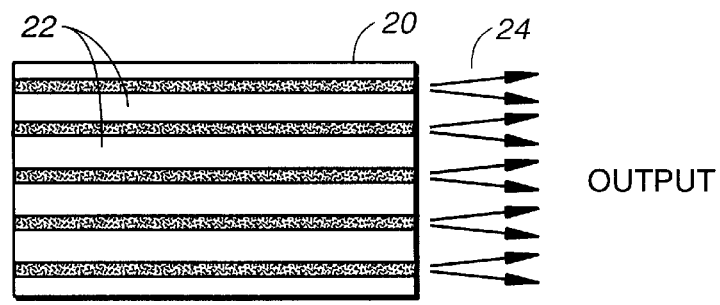
FIG._2
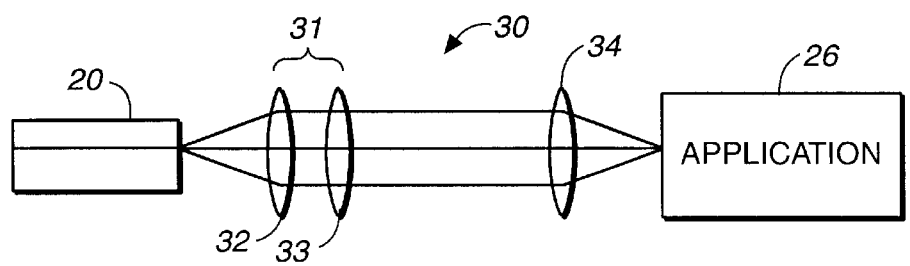
FIG._3
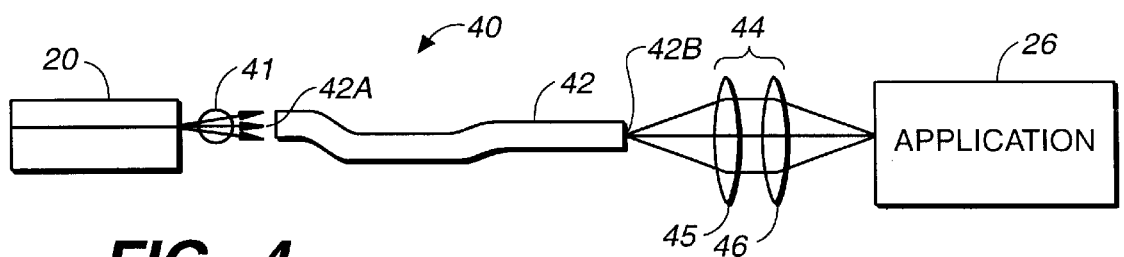
FIG._4

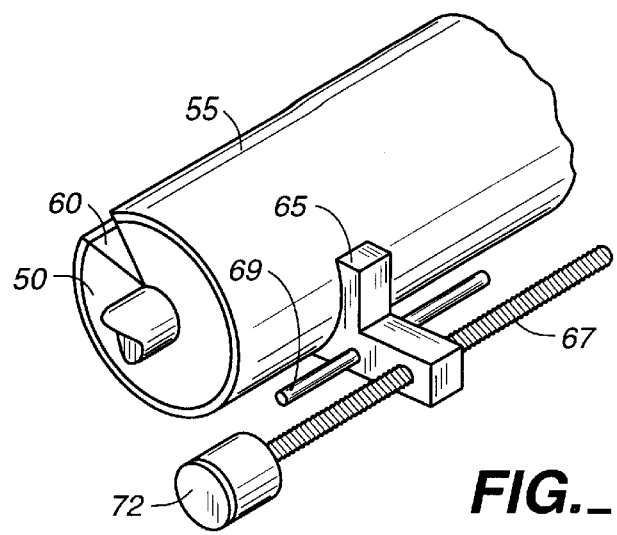
FIG._5
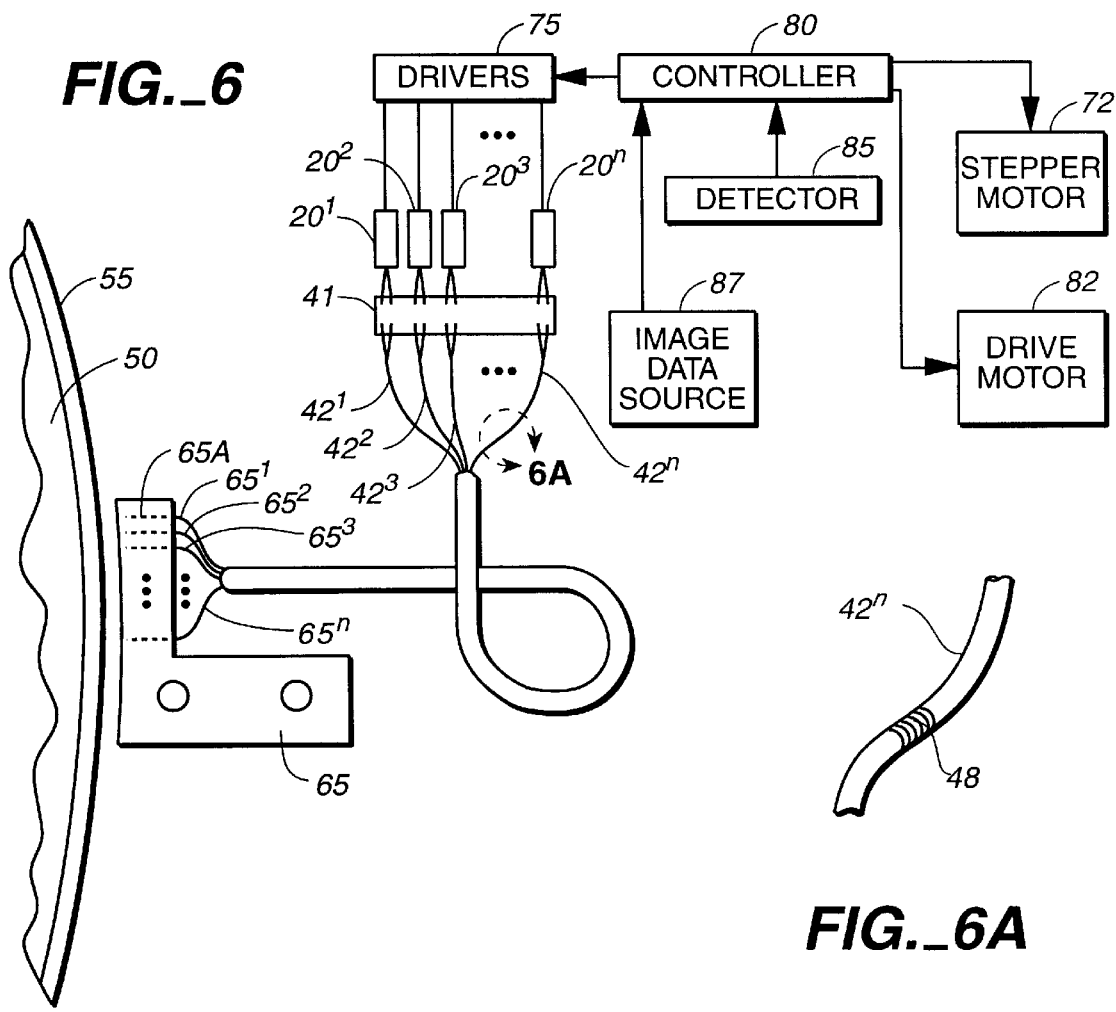
FIG._6
FIG._6A

LASER SYSTEM WITH REDUCED POWER FLUCTUATIONS FOR EMPLOYMENT IN APPLICATIONS REQUIRING CONTINUOUS STABLE LIGHT INTENSITY DELIVERY

CROSS REFERENCE TO RELATED APPLICATION

This application is a divisional of application Ser. No. 08/648,469, filed May 14, 1996, now U.S. Pat. No. 5,799,029, which is incorporated herein by its reference.

FIELD OF THE INVENTION

This invention relates generally to laser systems and more particularly to a laser system utilizing a multi-aperture laser source coupled to an aperture limited delivery system to provide for reduced intensity fluctuations in the delivered power.

In applications requiring comparatively high power output, broad area emission laser diodes have been employed because they provide high power delivery for applications that require small high power light sources with high power density, such as in the case of image generation devices, for example, laser imaging, thermal imaging and lithographic imaging. Such a laser diode 10 is illustrated in FIG. 1. Laser diode 10 may be, for example a broad area quantum well laser diode which provides a wide output aperture of emerging light to produce a high power output, such as from several hundreds of milliwatts to several watts of optical power. These laser diodes, due to their wide gain region, provide for broad area multiple transverse mode generation and, as a result, produce a multimode output. When the output is optically coupled to an aperture limited delivery system, such as an optical lens system or a multimode fiber, fluctuations in power delivery at the system output occurs due to several factors. First, small temperature and current density fluctuations cause the relative power in the laser cavity's multiple transverse modes to change. These changes result in a fluctuating divergence of the light beam emitted from the laser facet. When power delivered into a given numerical aperture system is measured, this changing laser source divergence results in power variations at the system output because the fixed numerical aperture of the delivery system will clip a portion of the laser power output according to changes in laser output angular divergence so that these divergence changes actually modulate the delivery system output numerical aperture.

Second, since the laser source output is divergent, it is necessary to collimate the laser output to collect the light for input into an aperture limited delivery system. This collimation increases the percentage of light reflected back from optical elements in the aperture limited delivery system. This reflected optical feedback is coupled back into the diode laser optical cavity causing changes in the intensity and brightness in the laser source output beam. This optical feedback is due also to thermal and physical variations in the aperture limited delivery system as well as reflections principally at regions of optical coupling between the input and output ends of the aperture limited delivery system. We refer to these variations as system external perturbations. The changes in power and intensity of the laser source output are due to phase changes in the reflected light which results in a time varying reflectivity versus wavelength for the optical feedback. In other words, perturbation changes in the aperture limited delivery system effectively cause changes in the effective optical path length of the system so that the reflected light in the system back into the laser source changes in phase and amplitude, favoring different modes over other modes, resulting in different operating properties to the laser source with resulting fluctuations in the laser output power intensity and in the pattern of intensity.

Optical feedback is also possible from the application to which the aperture limited delivery system delivers the optical beam, such as, signal sensing, imaging or printing applications. Optical feedback from some fraction of the laser source light output is coupled back, for example, from a recording medium, such as a photoreceptor or ablative printer surface in an image generation device, back through the multimode fiber into the laser source causing noise and instability in its operation. This is because the output power emitted from the laser source is directly affected by the phase and amplitude of the feedback and the phase of the feedback can be time varying due to vibrations and motions of the aperture limited delivery system components, for example, movement or contact of an optical fiber functioning as part of the aperture limited delivery system connected to a traveling imaging generation assembly or head which is translated along the surface of a rotated recording medium. Such motion and vibrations are further examples of system external perturbations.

These changes in intensity and brightness of the laser system output are not acceptable for applications requiring stable output intensity and brightness, such as in the case of achieving uniform image density in image generation. Thus, fluctuations or variations in intensity and brightness due to these external system perturbations in the optical feedback is unacceptable in producing stable light intensity and power for image creation purposes.

It is an object of this invention to provide a laser system for applications requiring stable intensity and brightness optical power output.

It is another object of this invention to provide a laser source to meet the above object of this invention which reduces amplitude fluctuations in the presence of optical feedback from associated optical system optical elements commonly employed with the laser source.

It is another object of this invention to improve the resistance of a laser source to optical feedback coupled back into the source from an aperture limited delivery system in order to reduce the affect of relative intensity noise at the laser source.

SUMMARY OF THE INVENTION

According to this invention, a laser source via an aperture limited delivery system provides a continuously stable light intensity and brightness beam for delivery to an application requiring constant power level delivery in spite of the laser source being subjected to optical feedback variations due to system optical feedback or external system induced perturbations. The laser source comprises a monolithic group of multiple independent, single mode laser sources which are substantially unaffected by this developed noise, providing stable light intensity with respect to time to a particular application with a serious delivery requirement for continuous and stable light intensity. The laser source provided for the application is characterized by having a broad emitting region with light beam output maintained as single mode operation because of discrete but yet monolithic laser sources. A specific example is a laser diode having multiple stripes, each stripe operating in a single transverse mode. Another but less preferred approach is a laser diode having multiple stripes with wide stripes that may possibly operate multimode but sufficiently stable if the wide stripes are sufficiently spaced apart so as not to have optical overlap, i.e., the spatial emitters are optically uncoupled so that noise generated in one emitter is not coupled into an adjacent emitter.

Another important aspect of this invention is laser redundancy through the employment of a multiple laser array having plural emitters that are operated below their rated operation and together provide sufficient power delivery to the intended application. If one or more of the emitters of the laser array should fail, the power to the remaining emitters may be increased within their rated operation to meet the power requirements of the application while still providing output beams substantially unaffected by this developed noise, providing stable light intensity with respect to time to the particular application.

The aperture limited delivery system may include a collimating lens system that focuses the laser stripe beams into a low divergence beam prior to coupling the laser source output into the aperture limited delivery system. Such a lens system may be a cylinder lens, and the aperture limited delivery system may be a multi-element optical system or an optical fiber. In the case of employing an optical fiber in the aperture limited delivery system, movement of the fiber causes changes in optical path length which results in changes in phase and amplitude in the reflected feedback of the delivery system detrimentally affecting the output of a multimode laser source through changes in beam output aperture divergence and in its intensity pattern, which is detrimental to image generation applications which have strict requirement for continuous, stable light intensity of the modulated beam output of the laser source. By employing a single mode laser source in this particular application, these changes in phase and/or amplitude in the reflected feedback light have little or insubstantial affect on the output intensity of the beam pattern so that the movement or bending of an optical fiber used in the aperture limited delivery system has little affect on the intensity pattern in the delivered output.

Other objects and attainments together with a fuller understanding of the invention will become apparent and appreciated by referring to the following description and claims taken in conjunction with the accompanying drawings.

BRIEF DESCRIPTION OF THE DRAWINGS

FIG. 1 is a schematic representation of a multimode laser source employed in the past for applications requiring stable light intensities.

FIG. 2 is a schematic representation of a multi-single mode laser source employed in the present invention for applications requiring stable intensity and brightness without substantial change relative to time provided via an aperture limited delivery system.

FIG. 3 is a schematic representation of a laser system of FIG. 2 as applied via an aperture limited delivery system comprising a collimating and focusing lens system.

FIG. 4 is schematic representation of a laser system of FIG. 2 as applied via an aperture limited delivery system comprising a multimode fiber.

FIG. 5 is a perspective view of an imaging generating device employing an imaging generation assembly.

FIG. 6 is a more detailed view of the imaging generation device of FIG. 5 comprising an imaging generation assembly, laser source and laser source driving circuit for creating an image on a recording medium with the imaging generating device. FIG. 6A is an enlarged detailed portion of a fiber in FIG. 6 to illustrate an additional embodiment.

PREFERRED EMBODIMENTS OF THE INVENTION

Reference is now made to FIG. 2 which discloses a multiple single transverse mode laser source 20 utilized in the practice of this invention. Monolithic multiple laser source 20 is characterized as having a broad emitting region with a light beam output with maintained single mode operation. In general, laser source 20 is designed to provide continuous single mode operation. In its simplest form, source 20 is a multiple emitter single transverse mode laser diode structure that comprises a plurality of laser cavities represented by laser stripes 22, e.g., 10 to 16 emitters, of narrow configuration, such as 3 µm wide stripes, that provide multiple, independent single mode outputs 24. Stripes 22 are sufficiently separated from one another, e.g., 10 µm, so as not to interfere with adjacent stripes in order to provide, independently of one another, single transverse mode operation resulting in total single mode output. By breaking up the broad stripe multiple transverse mode laser geometry laser, as currently used in image generation devices of the type shown in FIGS. 5 and 6 (discussed later), power fluctuations or changes output intensity or amplitude of the laser source resulting from different divergent multimodes and other optical feedback into the laser from an optically couple aperture limited delivery system, is significantly reduced. This reduction of feedback influence is due to the fact that, with a single transverse mode structure of laser source 20, there is no transverse mode competition between competing modes to cause variations in the angular divergence of the laser source output. The only requirement of laser source 20 is that it contain some mechanism that results in its multiple emitter output being single transverse mode. Thus, it is not essential, therefore, that a minimum distance be established between individual laser stripes 22 if the laser structure incorporates some structure that maintains the individual emitters of the laser source to maintain their single mode operation. Another example is separate channels formed in the monolithic laser chip so that the multiple optical cavities are optically separated but can be formed closer together. In the case where this mechanism is the separation between adjacent stripes 22, the minimum distance of separation between stripes 22 is about 10 µm, center to center, so that a ten emitter source having ten apertures would provide a broad base output about 100 µm wide for coupling into an aperture limited delivery system, such as shown in subsequent figures.

In another less preferred approach, the separate emitters of the laser array source could be composed of wider stripes that allow for multimode operation, although some noise will be experience as compared to the case of emitter single transverse mode operation. However, if the wider stripes are sufficiently spaced apart so that there is no coupling of modes from one emitter into adjacent emitters, i.e., no optical coupling between adjacent laser array emitters, then noise generated in one multimode emitter will not be coupled into an adjacent emitter affecting the overall multimodal operation of the array, i.e., the multimode operation of the independent, sufficiently separated emitters will remain stable and he emitters will not complete with one another which can cause intensity variations in their output beams.

In another aspect of this invention, a plurality of spatially separated emitters operating in a single transverse mode operation are provided in a number in excess of that required to meet optical power and light intensity levels so that, as a group, they operated below their rated value to provide for extended useful life. The use of additional multiple laser emitters in a monolithic laser array, therefore, decreases the power requirements of each laser while increasing the reliability of the devices without compromising the requirement for continuous stable light intensity required in applications as contemplated herein. Moreover, if any one or more of the emitters of the array fail, the output of the array can be increased to meet the requirements of the application with their operation remaining within the limits of their rated operation.

Lastly, the emitters may also be sufficiently spaced from one another so that their is adequate optical field and electrical field isolation from one another reducing the probability of catastrophic failure of emitters adjacent to a failed emitter. A major cause of emitter failure is what is termed, dark line defects which laterally propagate across the laser array, due to the influence of generated light or current pumping or the combination of both, causing catastrophic failure of adjacent emitters due to lateral dark line propagation from a defective emitter. Also, facet damage, such as in the form of facet blisters, which may propagate as defects laterally across one or more laser emitter facets in the laser array causing their failure. If the emitter are sufficiently spaced apart or otherwise isolated from one another the propagation of these defects will terminate or otherwise not be sufficient to cause damage to adjacent emitters and, therefore, will not directly affect their continued operation in the array for producing the require optical power output. The center-to-center separation between emitters in such cases should be about 13 $\mu$m or greater to achieve sufficient optical isolation. Electrical field isolation can be achieved by employing V-grooves between emitters, as is known in the art, or index guided arrays such as a buried heterostructure laser array, a ridge waveguide laser array, a channeled substrate waveguide laser array, a mesa waveguide laser array or an impurity induced disordered waveguide laser array. In the case of a planar layer type of device, such as a gain guided laser array, electrical isolation can be achieved with unpumped regions provided between the emitters or by separate electrical contacts provided for and individual addressing of the individual emitters of the laser array.

When the numerical aperture of the optical system into which the laser source power is delivered is limited or restricted, the numerical aperture of such an aperture limited delivery system can clip a portion of the laser source output if the laser output has varying divergence. As a result, these variations in laser divergence can modulate the aperture limited delivery system output numerical aperture and provide varying perturbations in reflected feedback from the application, such as reflected from the surface of an image recording medium back into the aperture limited delivery system, as well as perturbations from the aperture limited delivery system itself.

Examples of aperture limited delivery systems are shown in FIGS. 3 and 4 which are commonly known and employed. In FIG. 3, aperture limited delivery system 30 is a multielement optical system comprising collimating lens group 31 comprising light collecting lens 32 and collimating lens 33 which collimates the laser diverging beam to form a low divergence beam. Lens 34 focuses the power to a diffraction limited spot for use in conjunction with application 26. In FIG. 4, aperture limited delivery system 40 comprises a collimating lens for providing input to multimode fiber 42, the output of which is coupled via lens system 44 to application 26. Cylinder lens 41 collimates the laser divergent beam to a low divergence beam for input to fiber 42, and lens system 44 comprises focusing lens 46 which focuses the output beam from fiber 42, collimated by lens 45, to a diffraction limited spot for use in conjunction with application 26. Thus, optical fiber 42 has an input end 42A that receives the collimated light from cylinder lens 41 and has an output end 42B that delivers the beam to application 26 via lens system 44. In either of the systems of FIGS. 3 and 4, the lenses 34 and 44 may be omitted if application 26 does not require a focused spot. Any reflected feedback from application 26, such as light reflected back from the surface of a recording medium, back into aperture limited delivery system 30 or 40, or reflection feedback due to rearward reflections from optical elements 31, 34, 42, 44 as well as fiber ends 42A and 42B, can vary in phase and amplitude introducing noise in the optical cavity of laser source 20. We have discovered that such feedback will have little affect on the single mode operation of laser source 20.

We have conducted tests with a broad area multiple transverse mode laser source 10 and have found that employing a fiber 42 having an output numerical aperture of 0.11, power variations at output end 42B varied about 6% due to induced perturbations introduced by fiber motion and bending. However, in the case of employing laser source 20 comprising a five stripe single transverse mode laser source, power variations under the same conditions were reduced to less than 1%, that is, to a degree that there was no significant variation in delivered power intensity.

FIGS. 4 and 5 are examples of an application 26 with the use of several laser sources $20^n$ and aperture limited delivery system 40. This application is exemplified in detail in U.S. Pat. No. 5,385,092, issued Jan. 31, 1995, to Lewis et al. which is incorporated herein by reference thereto. In FIG. 5, there is shown an image forming drum for employment in imaging lithographic plates on-press systems or in off-press systems employing digitally controlled, high power, pulsed laser output. The drum comprises a cylinder 50 around which is positioned a recording medium, in the case here a lithographic plate 55, which is initially blank. Cylinder 50 includes a void segment 60 within which the marginal edges of plate 55 are clamped into position on the drum by clamps (not shown) to hold imaging plate 55 securely in position of cylinder 50. Cylinder 50 is supported on a frame and is rotated by drive motor 82 (FIG. 6) and the angular position of cylinder 50 is monitored by a shaft encoder (not shown). A image generating assembly 65 is provided with a plurality of beam presenting elements 65A that provide modulated outputs from laser sources $20^n$ via fibers $42^n$ to the surface of lithographic plate 55 to form an image on the plate by means of ablation. Such a principal of image generation can also be applied relative to a photoreceptor in electrographic printing, an ink transfer or ablative medium in thermal printing, or in any other such image generation device. All of these image generation on devices require continuous delivery of continuous, stable light beam intensity.

Image generating assembly 65 is mounted on a lead screw 67 and guide bar 69 for lateral movement across the surface of cylinder 50 upon rotational operation of step motor 72. In principal, step motor 72 is activated to return image generating assembly to a home position when the position of cylinder 50 has been rotated to a position with void segment 60 aligned adjacent to image generating assembly 65. When image generating assembly 65 has been so positioned for a next image pass, the image generating assembly 65 is then translated axially of cylinder 50 to form an ablative image on plate 55 according to image data presented to assembly 65 by pulsed or modulated laser sources $20^n$, via multimode fibers $42^n$ shown in FIG. 6. After an image pass has been completed, assembly 65 may be either return to a home position with the indexing of cylinder 50 in preparation of the next pass and subsequent imaging the next cylinder segment, or cylinder 50 is indexed in preparation for the next pass and assembly 65 is returned to home position while imaging the next cylinder segment. In either case, successive imaging passes are accomplished until imaging plate 55 has been completely imaged. Rotational indexing between successive imaged segments is determined by the number of imaging elements in image generating assembly 65 and their configuration in the assembly. The image resolution or printing density of the image can be increased if the elements are angularly aligned relative to an axis perpendicular to the rotational axis of cylinder 50, i.e., aligned along a diagonal with respect to such an axis. This diagonal alignment also permits an increase in the number of beam presenting elements 65A that may be placed in a single assembly 65.

As shown in FIG. 6, a plurality of single mode laser sources $20^1, 20^2, 20^3 \ldots 20^n$ are connected to and current modulated by drivers 75. The output of laser sources $20^1, 20^2, 20^3 \ldots 20^n$ is collimated by cylinder lens 41 and the individual modulated outputs of laser sources $20^1, 20^2, 20^3 \ldots 20^n$ are coupled into respective multimode fibers $42^1, 42^2, 42^3 \ldots 42^n$. The output ends of fibers $65^1, 65^2, 65^3 \ldots 65^n$ are coupled to image generating assembly 65, each to a respective beam presenting element 65A. Each beam presenting element 65A is an assembled lens and fiber holding device that couples the output of the respective fiber $42^n$ into a focusing lens system 44 for presentation as a diffraction limited spot on the surface of imaging plate 55. Controller 80 actuates laser drivers 75 when their associated beam presenting elements 65A have reached appropriate points in the image forming process along imaging plate 55 through the operation of stepper motor 72 and cylinder drive motor 82. Drivers 75 include, for example, a pulse generating circuit that is capable of generating at least 40,000 drive pulses per second with pulse widths of 10 $\mu$sec to 15 $\mu$sec, although pulse widths of smaller or greater duration are easily employed.

Controller 80 receives data from two sources. The angular position of cylinder 50 with respect to image generating assembly 65 is continually monitored via detector 85 which provides signals indicative of cylinder position. In addition, image data source 87, such as image data stored in a digital computer, provides data signals to controller 80 on demand. The image data defines points on plate 55 wherein image spots are to be created or written. Controller 80 correlates the instantaneous relative positions of image generating assembly 65 and plate 55, via detector 85, with the image data to actuate appropriate laser drivers at appropriate times during the scan of assembly 65 across plate 55 during a given cylinder segment.

It will be noted from FIG. 6, that the movement of image generating assembly 65 across plate 55 will move and bend the bundle of optical fibers $42^1, 42^2, 42^3 \ldots 42^n$ that provide output beams from laser sources $20^1, 20^2, 20^3 \ldots 20^n$ to assembly 65. Optical fibers are multimode, such as a double clad fibers, so that easy, efficient coupling of the emitted light output from laser source outputs can be accomplished with the larger input aperture these fibers provide. This movement causes changes in the optical path length of the fibers, resulting in changes in phase and amplitude in the output beams since these changes affect the feedback directed back into the laser cavity of laser sources $20^1, 20^2, 20^3 \ldots 20^n$. Optical fiber movement causes changes or induces filiamentation in the laser output of multimode laser sources $20^1, 20^2, 20^3 \ldots 20^n$ so that the far field of the laser beam output from such multimode laser sources varies in intensity. This is unacceptable to creating a image on plate 55 that is of continuous stable light intensity distribution. These changes are detrimental to image formation in the case where a multimode laser source 10 is employed causing changes in phase (time varying feedback of reflected light from system elements), temperature changes in fiber and at the laser as well as wavelength changes in the operation of laser source. As a result, the power intensity of the output beams will vary producing undesirable changes in image density and contrast at the image creation surface of imaging plate 55. The employment of high power laser sources $20^n$ that each provide a single transverse mode multi-emitter output substantially solves this problem. As demonstrated above, the employment of a single mode laser source 20, such as a monolithic multi-laser source $20^n$ of single mode emitters, coupled into a multimode fiber $42^n$, significantly reduces variances in light intensity of the beam outputs caused by the above mentioned factors. Regardless of the movement or bending of fibers 42, or changes in the phase or amplitude of reflected light back into the laser cavities, they have no substantial effect on the single mode operation of the emitters so that the intensity pattern of the delivered beam output from assembly 65 to plate 55 remains substantially uniform in the far field during translation of image generating assembly 65 across imaging plate 55.

It should be noted that if single mode fibers were employed in place of multimode fibers $42^1, 42^2, 42^3 \ldots 42^n$, changes in laser source wavelength due to reflected noise feedback or operating temperature changes of laser source, which also change the output pattern intensity, can be controlled by employing a fiber grating 48 in the single mode fibers $42^1, 42^2, 42^3 \ldots 42^n$, as illustrated in FIG. 6A relative to fiber $20^n$. Grating 48 in fiber $20^n$ is designed to provide a feedback reflectivity level back to laser source $20^n$ that is below that of the feedback reflectivity level of the individual laser facets of laser sources $20^1, 20^2, 20^3 \ldots 20^n$. Also, grating 48 should be placed in single mode fiber $42^n$ a distance away from the emitting facet of laser source $42^n$ equal to or greater than the coherence length of laser sources source $20^n$. Further, grating 48 should be provided in a portion of fiber $20^n$ that is maintained or kept substantially straight and protected it from bending so that its grating properties are not affected. Thus, the reflectivity of grating 48 as well as its wavelength are selected such that the broadband feedback provided from the laser diode cavity facet is greater than the feedback from fiber grating 48. The laser source can operate preferentially near the wavelength of lowest loss and, hence, the wavelength of the laser diode can be sifted from its free running value to the wavelength of the fiber grating. This can occur if the wavelength of the fiber grating is within the gain bandwidth of the laser diode, provided the magnitude of reflectivity from the grating is sufficient. This operation is detailed in U.S. Pat. No. 5,485,481, issued Jan. 16, 1996 to Brian F. Ventrudo et al. and assigned to the assignee herein and is incorporated herein by reference thereto. As indicated, the placement of grating 48 in fiber or fibers $42^n$ may be at least or longer than the coherence length of the laser source to ensure the maintenance of the coherence collapse of the laser emission. This distance must be much longer than the coherence length of the laser source under the prescribed conditions of optical feedback, so that optical feedback from the fiber grating remains incoherent, thus assuring the laser source remains in a state of coherence collapse.

Thus, a laser diode source that does not undergo transitions of single longitudinal laser cavity modes, as is the case in a free-running laser diode, causing large intensity fluctuations in the laser diode output due to competition between two modes during the transition can be employed also with this invention. These mode transitions are caused by changes in laser injection current or temperature, for example, and are detrimental to the beam output for application 26 requiring stable light intensity in the beam output pattern. The optical output of such a laser may have twenty or more longitudinal modes developed in the external optical cavity created by optical fiber 42. Although the partitioning of optical power between the modes may change, there is much less fluctuation in laser intensity compared to that of a single mode, free-running laser diode. Therefore, by employing grating 48, even a multimode laser can alternatively be employed by maintenance of laser wavelength operation and elimination of competition among modes so that the intensity pattern of the delivered beam output from image generating assembly 65 to imaging plate 55 remains substantially uniform in the far field.

Although the invention has been described in conjunction with one or more preferred embodiments, it will be apparent to those skilled in the art that other alternatives, variations and modifications will be apparent in light of the foregoing description as being within the spirit and scope of the invention. Thus, the invention described herein is intended to embrace all such alternatives, variations and modifications that are within the spirit and scope of the following claims.

What is claimed is:

1. A laser system comprising:

a monolithic laser diode source having multiple emitters for providing multiple light outputs;

an aperture limited optical delivery system optically coupled to said laser diode source to receive said light outputs for delivery thereof at its output to an optical, utilizing component;

noise generated in said system via feedback of a portion of light from said optical utilizing component causing variations in light intensity from one or more of said multiple emitters;

said multiple emitters separated to provide for substantial optical and electrical field isolation therebetween to reduce the effect of said feedback noise of emitters so that said multiple emitters provide light outputs of continuous stable light intensity.

2. The laser system of claim 1 wherein said multiple emitters each separated by a region which prevents light from each emitter from interacting with light from adjacent emitters.

3. The laser system of claim 1 wherein said multiple emitters each separated by a region which is unpumped.

4. The laser system of claim 1 wherein said multiple emitters each separated by a region which prevents light from each emitter from interacting with light from adjacent emitters and are unpumped.

5. The laser system of claim 1 wherein said laser diode source emitters are index guided lasers.

6. The laser system of claim 5 wherein said index guided lasers comprise a buried heterostructure laser, a ridge waveguide laser, a channeled substrate waveguide laser, a mesa waveguide laser or an impurity induced disordered waveguide laser.

7. The laser system of claim 1 wherein said aperture limited optical delivery system is a multimode optical fiber.

8. The laser system of claim 7 wherein said optical utilizing component is an image generation device.

9. The laser system of claim 8 wherein said image generation device comprises an ablative surface upon which an image is formed by means of said light output delivery.

10. The laser system of claim 1 wherein said optical coupling between said laser diode source and said aperture limited optical delivery system is a lens system.

11. The laser system of claim 10 wherein said lens system comprises a cylinder lens.

12. The laser system of claim 1 wherein said light outputs are single transverse mode.

13. The laser system of claim 1 wherein said light outputs are multimode.

14. The laser system of claim 1 wherein said multiple emitters are spaced apart by at least about 13 $\mu$m or more.

* * * * *